United States Patent [19]

Reddy

[11] Patent Number: 4,508,978

[45] Date of Patent: Apr. 2, 1985

[54] REDUCTION OF GATE OXIDE BREAKDOWN FOR BOOTED NODES IN MOS INTEGRATED CIRCUITS

[75] Inventor: Chitranjan N. Reddy, Houston, Tex.

[73] Assignee: Texas Instruments Incorporated, Dallas, Tex.

[21] Appl. No.: 419,117

[22] Filed: Sep. 16, 1982

[51] Int. Cl.³ .................... H03K 17/08; H03K 17/10; H03K 17/687
[52] U.S. Cl. .................................. 307/482; 307/443; 307/481; 307/578; 307/269
[58] Field of Search ................... 307/443, 200 B, 453, 307/482, 577, 578, 264, 269, 480–481

[56] References Cited

U.S. PATENT DOCUMENTS 3,818,245 6/1974 Suzuki et al. ................... 307/577 X
4,051,388 9/1977 Inukai ............................. 307/482 X
4,199,695 4/1980 Cook et al. ...................... 307/482 X
4,239,990 12/1980 Hong et al. ...................... 307/601 X
4,239,991 12/1980 Hong et al. ...................... 307/601 X
4,379,974 4/1983 Plachno .............................. 307/269

Primary Examiner—Stanley D. Miller
Assistant Examiner—D. R. Hudspeth
Attorney, Agent, or Firm—John G. Graham

[57] ABSTRACT

In a clock generator circuit for a dynamic RAM or the like it is necessary to boot certain nodes to a value to above the supply voltage in order to provide a high-level gate voltage for output transistors. To prevent excess voltage on the gate oxide of a transistor connected to a booted node, a series transistor is added which has the supply voltage on its gate, so neither transistor will have the full booted voltage across its gate oxide.

9 Claims, 3 Drawing Figures

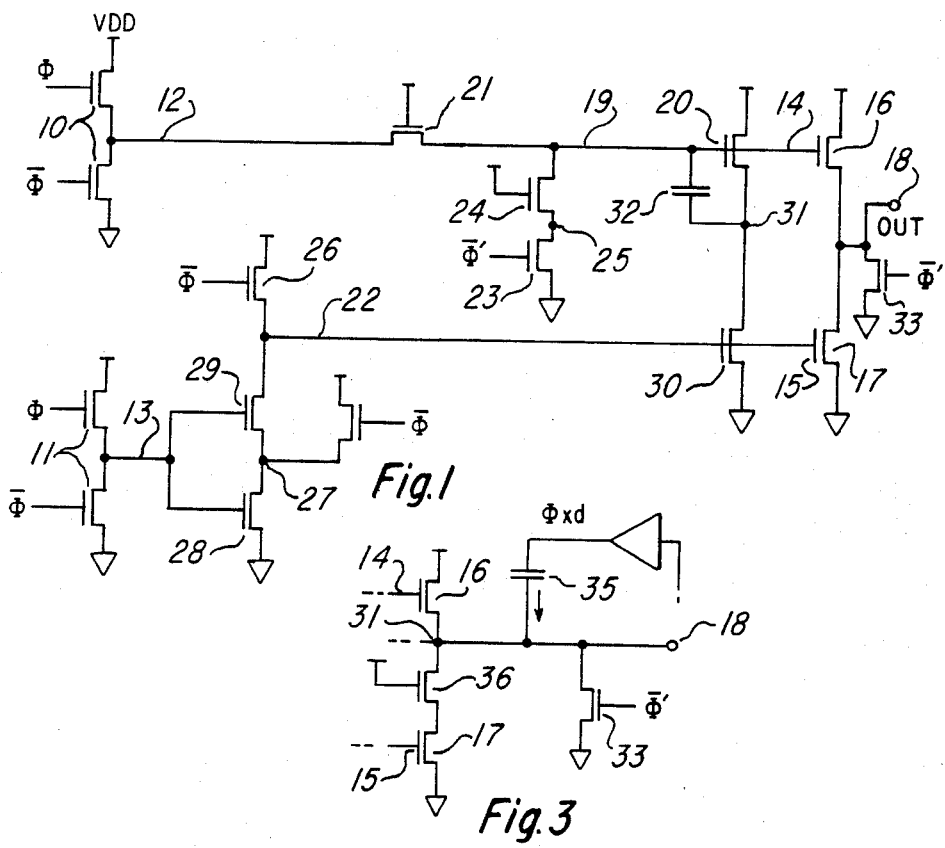
Fig. 1
Fig. 3
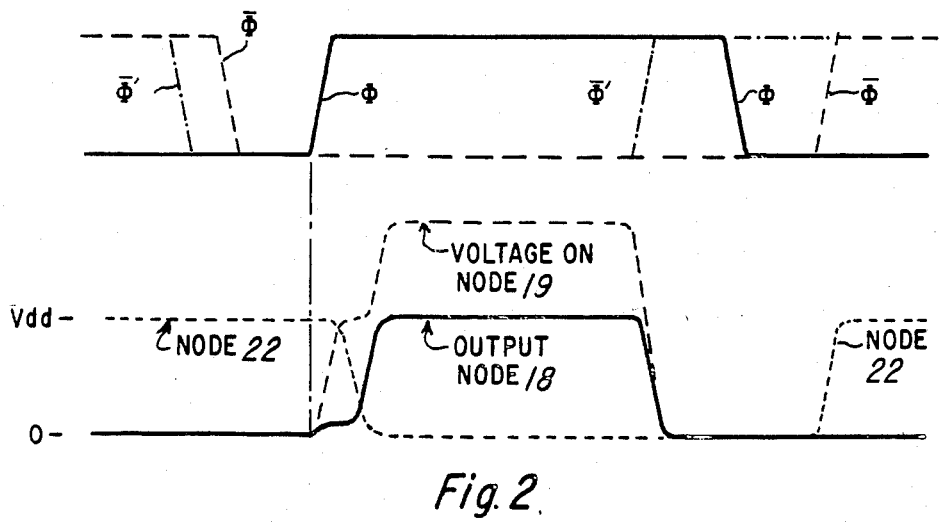
Fig. 2

4,508,978

REDUCTION OF GATE OXIDE BREAKDOWN FOR BOOTED NODES IN MOS INTEGRATED CIRCUITS

BACKGROUND OF THE INVENTION

This invention relates to semiconductor devices, and more particularly to clock generator circuits of the type used in VLSI semiconductor memory devices.

Semiconductor integrated circuit devices are being constructed with ever-increasing circuit density. Dynamic MOS memory devices are now being developed containing 256K bits, and 1-Megabit devices will soon be designed. These devices require scaling of the transistor sizes, i.e. reduction in the physical size of each part of the transistor, including the thickness of the gate oxide. With gate oxide of 200 Å thickness and supply voltage of +5V, the electric field across the gate oxide can cause failures due to dielectric breakdown. In particular, booted nodes are needed in clock generator circuits or the like to assure full logic-level outputs, and transistors connected to such booted nodes are subjected to excess electric field across the gate oxide.

It is the principal object of this invention to provide improved clock generator circuits for semiconductor integrated circuits such as memory devices. Another object is to provide improved protection from overvoltage for the gate oxide of MOS field-effect transistors as may be used in circuits having high-level booted nodes.

SUMMARY OF THE INVENTION

In accordance with one embodiment of the invention, in a clock generator circuit for a dynamic RAM or the like it is necessary to boot certain nodes to a value above the supply voltage in order to provide a high-level gate voltage for output transistor. To prevent excess voltage on the gate oxide of a transistors connected to a booted node, a series transistor is added which has the supply voltage on its gate, so neither transistor will have the full booted voltage across its gate oxide.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is an electrical schematic diagram of a clock generator circuit according to the invention;

FIG 2. is a timing diagram showing voltage as a function of time for various nodes in the circuit of FIG. 1; and FIG. 3 is a circuit diagram like FIG. 1 according to another embodiment of the invention.

DETAILED DESCRIPTION OF SPECIFIC EMBODIMENT

Referring to FIG. 1, a clock generator circuit of the type used in a VLSI type semiconductor memory device is illustrated. Typically, the device may be a 256K-bit dynamic read/write memory using one-transistor cells generally as shown in U.S. Pat. No. 4,239,993, issued to McAlexander, White & Rao, assigned to Texas Instruments. A number of high-level clocks must be generated on the chip in a memory device as in such patent; the clock voltages must drive capacitances of perhaps 50 to 100 pfd, at a voltage level at or very near the supply Vdd, and the timing delays are preferably in the nature of a few nanoseconds. U.S. Pat. Nos. 4,239,990 and 4,239,991 issued to Hong et al, assigned to Texas Instruments show the general type of clock generator used in the memory device of U.S. Pat. No. 4,239,993.

In FIG. 1 a basic low-level clock Φ with its corresponding precharge clock $\overline{\Phi}$ drive two push-pull input stages consisting of pairs of transistors 10 and 11; these clock voltages are seen in FIG. 2. Generally, the clock Φ is one of the active cycle clocks derived from one of the inputs to the device such as $\overline{RAS}$, $\overline{CAS}$ or chip select, whereas the clock $\overline{\Phi}$ is a precharge cycle clock. The voltages on the output nodes 12 and 13 from the input stages 10 and 11 are used to drive the circuits which control the gates 14 and 15 of two large push-pull output transistors 16 and 17, producing a high level output on node 18. The Φ clock drives the gate 15 high, holding the node 18 down at Vss by conduction of the transistor 17. Nodes 12 and 13 are also held low by $\overline{\Phi}$. When Φ goes high as seen in the timing diagram of FIG. 2, the gate 14, which is also the node 19 at the gate of the transistor 20, is charged to Vdd-Vt through the decoupling transistor 21. This transistor 21, having Vdd on its gate, allows the node 19 to be charged, but then isolates the input. Then, the node 19 is booted to above Vdd when the node 22 (also gate 15), is discharged, providing sufficient drive for the gate 14 of the transistor 16 for a proper high-level output on the node 18. The node 19 is discharged when the clock $\overline{\Phi}'$ goes high, see FIG. 2, by a transistor 23 and a series transistor 24 having Vdd on its gate. This part of the circuit is an important feature of the invention because, during the time the node 19 is at a level higher than Vdd, the gate oxide of the transistor 23 must be protected from excessive voltage which would tend to cause breakdown failure. This is especially important where the gate oxide is very thin, about 200 Å, as needed in scaled VLSI devices. The stress on the gate oxide is increased when the part is operated at higher than nominal supply voltages and temperatures, reducing reliability and performance. To reduce the effects of the electric field on the gate oxide of the transistor 23, the device 24 in series with the transistor 23 drops part of the voltage on node 19 so the electric field is less than the node 19 to ground voltage seen in FIG. 2. No node in the discharge path has more than Vdd across it. That is, the voltage at the node 25 is no more than Vdd-Vt, and the voltage between node 19 and node 25 is also no more than Vdd-Vt.

The node 22 is precharged to Vdd-Vt by the transistor 26 when $\overline{\Phi}$ is high, and so is the node 27; these nodes stay high when $\overline{\Phi}$ goes to ground, because node 13 is held low during $\overline{\Phi}$ and transistors 28 and 29 are off. Then, when Φ goes high, node 13 goes high, and after the selected delay as set forth in U.S. Pat. No. 4,239,990 the node 22 is discharged through transistors 28 and 29. This turns off the transistor 30, allowing node 31 to go toward Vdd as transistor 20 turns on due to the voltage on node 19 being driven by Φ through transistor 21. As node 31 goes toward Vdd, the node 19 is booted above Vdd through capacitor 32.

The ouput pulse on node 18 is terminated by a transistor 33 which has the Φ' clock on its gate. This same clock $\overline{\Phi}'$ is used to discharge the booted node 19 as discussed above.

Another embodiment of the invention is illustrated in FIG. 3, where all of the circuitry prior to transistors 16 and 17 is the same as FIG. 1. What is added is a booting voltage input via capacitor 35 whereby a clock Φ×d functions to boot the output voltage on the node 18 to a level higher than Vdd. This type of booted clock is used for an X-address voltage as explained in said U.S. Pat. No. 4,239,993. The clock Φ×d is merely a slightly delayed version of the output voltage on the node 18 and is derived therfrom; this delay is much less than the width of output voltage on node 18 as illustrated in FIG. 2. To prevent undue stress on the gate oxide of the transistor 17, a series transistor 36 with Vdd on its gate is added. The net electric field seen by the gate oxide of transistor 17 is thus no more than Vdd-Vt. The transistors 36 and 17 are of sufficient size to produce a proper zero level while predischarging the capacitor 32, if necessary.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed :

1. A clock generator circuit for producing a high level clock voltage, comprising:
   an output transistor, an input transistor, a decoupling transistor, and a pair of discharge transistors, each of such transistors having a source-drain path and a gate,
   a clock voltage input connected to the gate of the input transistor, the source-drain path of the input transistor being connected between a supply voltage and an input node,
   means connecting the source-drain path of the decoupling transistor in series between said input node and the gate of the output transistor, the gate of the decoupling transistor being coupled to said supply voltage,
   the source-drain path of the output transistor being connected between said supply voltage and an output node,
   first means for booting said gate of the output transistor to a voltage level higher then said supply voltage at a selected time after a delay, in response to said clock voltage input,
   first means for discharging said gate of the output transistor comprising a series connection of the source-drain paths of said pair of discharge transistors connected between said gate of the output transistor and reference potential, the gate of the discharge transistor adjacent said reference potential having a discharge clock voltage thereon and the gate of the other discharge transistor having a said supply voltage thereon, said discharge clock voltage occurring after said gate of the output transistor is booted,
   second means for booting said output node to a voltage level higher than said supply voltage at a time after said selected time,
   second means for discharging said output node, comprising a series connection of the source-drain paths of a pair of pull-down transistors, the gate of the pull-down transistor adjacent said output node being coupled to said supply voltage and the gate of the other of said pull-down transistors being coupled to turn said other pull-down transistor off at said selected time.

2. A circuit according to claim 1 wherein said transistors are insulated-gate field-effect transistors.

3. A circuit according to claim 2 formed in an integrated semiconductor device.

4. A circuit according to claim 3 wherein said first means for booting includes first and second transistors, each having a source-drain path and a gate, with the source-drain paths connected in series between said supply voltage and said reference potential, the gate of the first transistor being connected to the gate of the output transistor, the gate of the second transistor being connected to be turned off after said input clock goes high, and capacitive means coupling a node between said source-drain paths of the first and second transistors to said gate of the output transistor.

5. A circuit according to claim 4 wherein said gate of the second transistor is connected to the gate of said other of said pull-down transistors, the source-drain paths of the pull-down transistors being connected between said output node and reference potential.

6. A clock generator circuit for producing a high level clock voltage at an output node in response to an input clock applied to an input node, comprising:
   an output transistor and a pair of discharge transistors, each of such transistors having a source-drain path and a gate,
   coupling means connecting said input node to the gate of the output transistor,
   the source-drain path of the output transistor being connected between a supply voltage and said output node,
   first means for booting said gate of the output transistor to a voltage level higher than said supply voltage after a delay in response to said clock input.
   first means for discharging said gate of the output transistor comprising a series connection of the source-drain paths of said pair of discharge transistors connected between said gate of the output transistor and reference potential, the gate of the discharge transistor adjacent said reference potential having a discharge clock voltage thereon and the gate of the other discharge transistor having said supply voltage thereon, said discharge clock voltage occurring after said gate of the output transistor is booted,
   second means for booting said output node to a voltage level higher than said supply voltage at a time after a selected time,
   second means for discharging said output node, comprising a series connection of the source-drain paths of a pair of pull-down transistors, the gate of the pull-down transistor adjacent said output node being coupled to said supply voltage and the gate of the other of said pull-down transistors being coupled to turn said other pull-down transistor off at said selected time.

7. A circuit according to claim 6 wherein said transistors are insulated-gate field-effect transistors formed in an integrated semiconductor device.

8. A circuit according to claim 7 wherein said first means for booting includes first and second transistors, each having a source-drain path and a gate, with the source-drain paths connected in series between said supply voltage and reference potential, the gate of the first transistor being connected to the gate of the output transistor, the gate of the second transistor being connected to be turned off after said input clock goes high, and capacitive means coupling a node between said source-drain paths of the first and second transistors to said gate of the output transistor.

9. A circuit according to claim 8 wherein said gate of the second transistor is connected to the gate of said other of said pull-down transistors, the source-drain paths of the pull-down transistors being connected between said output node and reference potential.

* * * * *